(12) United States Patent
Kadanka

(10) Patent No.: US 6,556,083 B2
(45) Date of Patent: Apr. 29, 2003

(54) METHOD AND APPARATUS FOR MAINTAINING STABILITY IN A CIRCUIT UNDER VARIABLE LOAD CONDITIONS

(75) Inventor: Petr Kadanka, Valasska Bystrice (CZ)

(73) Assignee: Semiconductor Components Industries LLC, Phoenix, AZ (US)

( * ) Notice: Subject to any disclaimer, the term of this patent is extended or adjusted under 35 U.S.C. 154(b) by 106 days.

(21) Appl. No.: 09/736,461

(22) Filed: Dec. 15, 2000

(65) Prior Publication Data

US 2002/0105382 A1 Aug. 8, 2002

(51) Int. Cl.[7] .............................. H03F 1/14; H03F 1/34; H03F 1/36; H03G 3/12

(52) U.S. Cl. ...................... 330/292; 330/294; 330/109; 330/282

(58) Field of Search ............................... 330/292, 294, 330/109, 282

(56) References Cited

U.S. PATENT DOCUMENTS

| | | | | |
|---|---|---|---|---|
| 3,701,037 A | * | 10/1972 | Holsinger | .................. 330/107 |
| 4,220,817 A | * | 9/1980 | Kampmann | .................. 330/109 |
| 4,745,622 A | * | 5/1988 | Gupta | ........................ 178/69 N |
| 4,996,497 A | | 2/1991 | Waehner | |
| 5,786,730 A | * | 7/1998 | Hadley | ................. 250/214 AG |
| 6,137,356 A | * | 10/2000 | Sakuragi | ..................... 330/136 |
| 6,396,934 B1 | * | 5/2002 | Federspiel | .................. 330/282 |

* cited by examiner

*Primary Examiner*—Patricia T. Nguyen

(57) ABSTRACT

A circuit (10) having multiple poles within an active frequency range employs a movable zero (66) to maintain stability in the circuit (10) under variable load conditions. A pole (62) created by a frequency compensation element (14) maintains a fixed frequency within the active frequency range of the circuit (10). In addition, a variable load impedance (36) coupled to the circuit (10) generates a load pole (64) within the active frequency range of the circuit (10) that changes frequency over time. As the load pole (64) changes frequency, the frequency of the movable zero (66) is adjusted to achieve an enhanced stability condition within the circuit (10). In one embodiment, the frequency of the movable zero (66) tracks the frequency of the load pole (64) as the load impedance (36) changes.

21 Claims, 5 Drawing Sheets

METHOD AND APPARATUS FOR MAINTAINING STABILITY IN A CIRCUIT UNDER VARIABLE LOAD CONDITIONS

FIELD OF THE INVENTION

The invention relates generally to techniques for maintaining stability within an electrical circuit and, more particularly, to techniques for maintaining stability in a circuit under variable load conditions.

BACKGROUND OF THE INVENTION

Some electrical circuitry is required to operate under a wide variety of different load conditions. For example, a voltage regulator circuit is typically required to maintain a regulated output voltage even when there is a widely varying load impedance coupled to the regulator. As can be appreciated, such circuitry must remain stable for all possible load conditions. The load impedance that is coupled to the circuitry can introduce a pole into the transfer function of the circuitry that is located within the active frequency range of the circuitry. In addition, the circuitry itself can also generate one or more poles that are within the active frequency range of the circuitry. For example, a frequency compensation capacitor within a circuit will often generate a dominant pole within the active frequency range of the circuit.

As is well known, the presence of two or more poles within the active frequency range of a circuit can lead to instability within the circuit unless additional measures are taken to prevent such instability. Typically, a zero is added to the transfer function of the circuitry to counteract the effect of having two poles within the active frequency range. The zero that is added to the transfer function will have a frequency that lies near that of one or both of the poles in a position that will prevent instability. In a circuit having a variable load impedance, however, the frequency of the load pole can vary greatly during normal circuit operation. Thus, while the fixed location of the zero may be optimal for some possible load conditions, it will generally be sub-optimal under other possible load conditions. Typically, the frequency of the zero will be chosen to provide optimal compensation for an intermediate load condition, thus compromising circuit stability under high and low load conditions.

Therefore, there is a need for a method and apparatus for maintaining the stability of a circuit under variable load conditions.

DETAILED DESCRIPTION OF THE DRAWINGS

Figure 1:
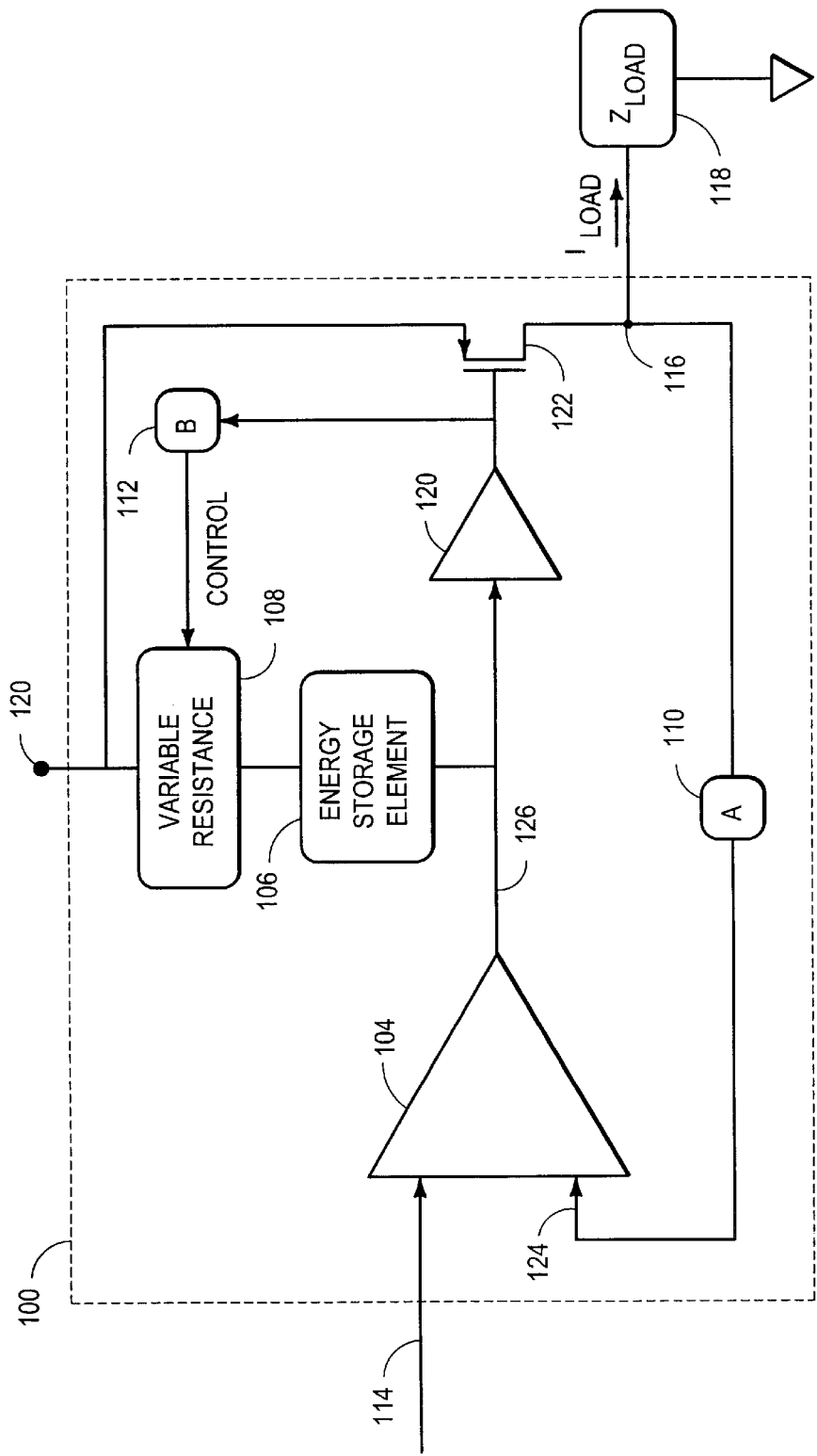
FIG. 1 is a block diagram illustrating a feedback amplifier system in accordance with one embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to a method and apparatus for maintaining stability within a circuit under variable load conditions. A movable zero is introduced into the transfer function of the circuitry that is responsive to a variable load impedance coupled to the circuitry. That is, as the load impedance changes, the frequency of the movable zero changes in a manner that maintains an enhanced stability state within the circuitry. In one approach, the circuitry is configured so that the frequency of the movable zero moves with or tracks the frequency of a load pole generated by the load impedance as the load pole frequency changes. In this manner, the movable zero is continuously in a position to prevent instability regardless of the present load condition. The inventive principles are particularly beneficial in circuits that include feedback amplifier structures utilizing frequency compensation techniques. In one embodiment, for example, the inventive principles are used to provide stability within the output stage of a voltage regulator circuit that includes an operational amplifier having a compensation capacitor coupled thereto to provide frequency compensation. As will be apparent to a person of ordinary skill in the art, other circuit arrangements are also possible.

FIG. 1 is a block diagram illustrating a feedback amplifier system 100 in accordance with one embodiment of the present invention. As illustrated, the feedback amplifier system 100 includes: an amplifier 104, an energy storage element 106, a variable resistance 108, a buffer amplifier 120, an output transistor 122, a first feedback unit 110 (A), and a second feedback unit 112 (B). The feedback amplifier system 100 also includes an input terminal 114 to receive a reference voltage and an output terminal 116 for use in delivering a processed signal to an external load impedance 118 ($Z_{LOAD}$). The first feedback unit 110 is coupled between the output terminal 116 and an input terminal 124 of the amplifier 104 for feeding back a portion of the output signal to the input of the system 100. Typically, this will be a negative feedback arrangement. The amplifier 104 is an amplifier with a high output impedance (e.g., an operational transconductance amplifier (OTA)) that compares the feedback signal to the reference voltage on the input terminal 114 to generate an output signal at output terminal 126. The output signal is then amplified by the buffer amplifier 120 and delivered to the gate terminal of the output transistor 122 to control a load current delivered to the load impedance 118. The output of the amplifier 104 is isolated from the gate capacitance of the output transistor 122 by the buffer amplifier 120 which has a high input impedance and a low output impedance. Thus, the gate capacitance of the output transistor 122 does not have significant influence on the frequency characteristic within the active frequency range of the system 100. The load impedance 118 can change significantly during system operation and the system 100 is required to maintain its stability during such load impedance changes.

The energy storage element 106 is provided on the output of the amplifier 104 to provide frequency compensation for the system 100. In the illustrated embodiment, the energy storage element 106 is coupled between the output terminal 126 of the amplifier 104 and a supply terminal 120 of the system 100 (although other locations are also possible). To provide frequency compensation, the energy storage element 106 introduces a low frequency dominant pole into the transfer function of the system 100 that is located within the active frequency range of the system 100. In addition, the load impedance 118 can introduce another pole (i.e., a load pole) into the transfer function of the system 100 that is also located within the active frequency range of the system 100. As is well known, the presence of multiple poles within the active frequency range of a device can lead to serious instability problems unless efforts are taken to counteract the effects of the poles. In the system 100 of FIG. 1, this situation is aggravated by the fact that the frequency of the load pole can change during system operation based on a changing load impedance 118. The variable resistance 108 is included in the system 100 to introduce a movable zero into the transfer function of the system 100 to counteract the potentially deleterious effect of having multiple poles within the active frequency range of the system 100. In the illustrated embodiment, the variable resistance 108 provides a controllable electrical resistance between the energy storage element 106 and the supply terminal 120 to generate the movable zero. The frequency of the movable zero is dynamically adjusted during system operation, based on changing load conditions, to maintain an enhanced stability condition within the system 100.

As illustrated in FIG. 1, the second feedback unit 112 is coupled between the gate terminal of the output transistor 122 and a control terminal of the variable resistance 108. As described previously, the gate voltage of the output transistor 122 is directly related to the load current being supplied to the load impedance 118 by the output transistor 122. The second feedback unit 112 generates a control voltage for the variable resistance 108 that is based on the variable load current being drawn by the load impedance 118. The control voltage applied to the variable resistance 108 varies the resistance thereof so that the frequency of the movable zero generated by the variable resistance 108 is dynamically adjusted during system operation to provide an enhanced stability condition in the system 100 in light of the changing frequency of the load pole (which is related to the load current being drawn by the load impedance 118). In one approach, for example, the frequency of the movable zero is adjusted so that it tracks the frequency of the load pole as it changes. Thus, the zero is always in a position to counteract the potentially damaging effects (i.e., instability) that can be caused by the load pole during system operation. As will be appreciated by a person of ordinary skill in the art, other techniques for providing control feedback to the variable resistance 108 based on the changing load impedance 118 are also possible.

Figure 2:
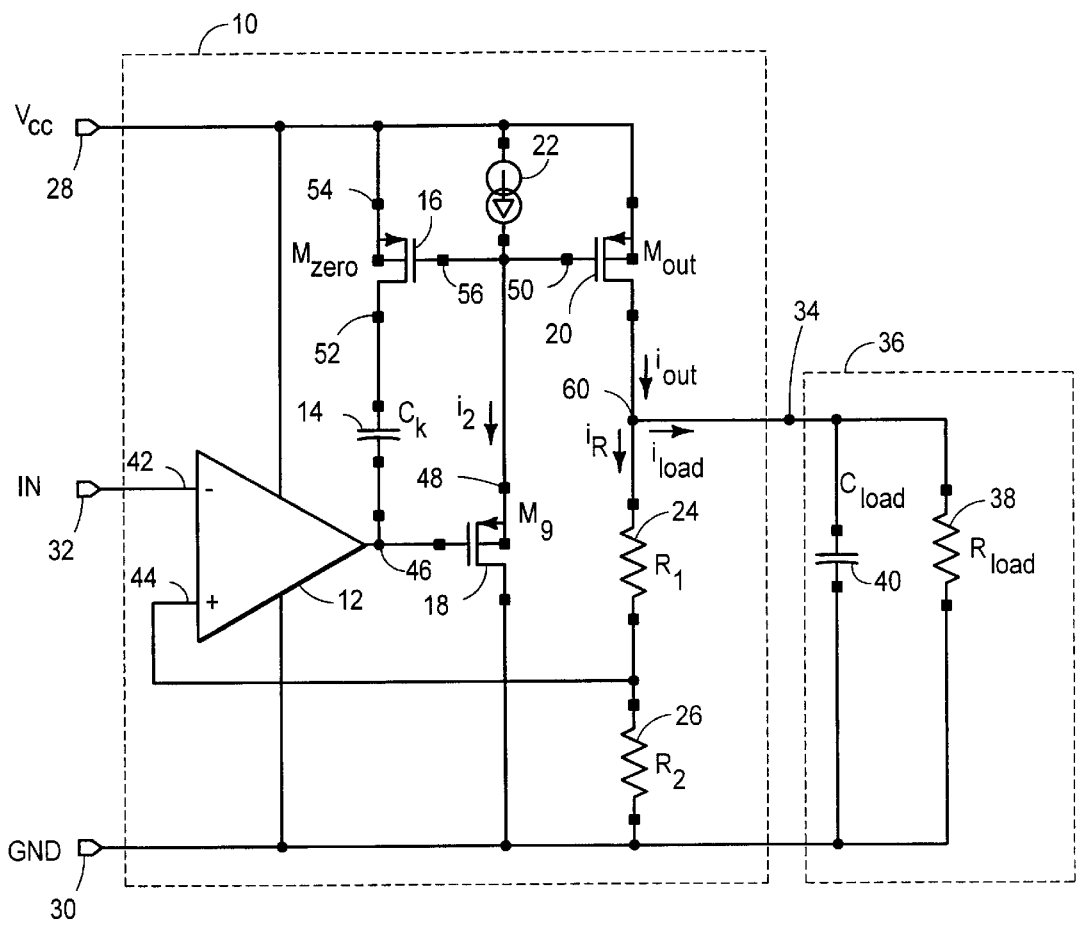
FIG. 2 is a schematic diagram illustrating the output stage of a low dropout voltage regulator (LDO) in accordance with one embodiment of the present invention.

FIG. 2 is a schematic diagram illustrating the output stage 10 of a low dropout voltage regulator (LDO) in accordance with one embodiment of the present invention. As illustrated, the LDO output stage 10 includes: an operational amplifier (OPAMP) 12, a compensation capacitor 14, a first transistor 16 ($M_{zero}$), a second transistor 18 ($M_9$), a third transistor 20 ($M_{out}$), a current source 22, and first and second resistors 24, 26 ($R_1$, $R_2$). The LDO output stage 10 also includes a supply node 28 ($V_{CC}$), a ground node 30 (GND), an input terminal 32 (IN), and an output terminal 34. During operation, the supply node 28 is coupled to a power supply and the ground node 30 is coupled to a system ground. In addition, a load impedance 36 is coupled to the output terminal 34 of the LDO output stage 10. In practice, the load impedance 36 will normally be the input impedance of a circuit being driven by the LDO output stage 10. The LDO output stage 10 receives an input voltage signal (e.g., a reference voltage) at the input terminal 32 and uses the signal to maintain a regulated voltage level on the output terminal 34. The LDO output stage 10 will typically be required to provide a regulated output voltage for a wide range of different load impedances and load conditions. In addition, the load impedance 36 will commonly include a relatively large capacitive component. In the illustrated embodiment, the load impedance 36 includes a load resistor 38 ($R_{load}$) and a load capacitor 40 ($C_{load}$) in a parallel arrangement. During LDO operation, the values of both the load resistor 38 and the load capacitor 40 may vary.

The LDO output stage 10 uses feedback techniques to maintain a regulated voltage level on the output terminal 34. The first and second resistors 24, 26 are coupled in series between the output terminal 34 and the ground node 30 to form a voltage divider for use in feeding back a portion of the output voltage to the non-inverting input 44 of the OPAMP 12. The inverting input 42 of the OPAMP 12 is coupled to the input terminal 32 of the LDO output stage 10 for receiving the input voltage signal. The OPAMP 12 amplifies the difference between the input voltage signal and the feedback signal to generate an output signal at the output 46 of the OPAMP 12. The output signal of the OPAMP 12 is applied to the gate terminal (i.e., the input terminal) of the second transistor 18 which is configured as a source follower (i.e., the source voltage of the second transistor 18 will follow the gate voltage). The current source 22 is coupled to the upper source/drain terminal 48 of the second transistor 18 for delivering a relatively constant current $i_2$ through the output portion of the second transistor 18. The upper source/drain terminal 48 of the second transistor 18 is also coupled to the gate terminal 50 (i.e., input terminal) of the third transistor 20. Therefore, voltage changes on the gate terminal of the second transistor 18 will cause voltage changes in the opposite direction on the gate terminal 50 of the third transistor 20.

The third transistor 20 provides a variable output current $i_{out}$ having a magnitude that is controlled by the gate voltage of the third transistor 20. As illustrated, the output current $i_{out}$ is divided into two components at an output node 60; namely, $i_{load}$ which flows to the load impedance 36 and $i_R$ which flows into the series resistors 24, 26. When the resistance of the load resistor 38 is small, a relatively large load current $i_{load}$ flows and the LDO output stage 10 is said to be operating under heavy load conditions. Conversely, when the resistance of the load resistor 38 is high, a relatively small load current $i_{load}$ flows and the LDO output stage 10 is said to be operating under light load conditions. The goal of the output stage 10 is to maintain a substantially constant current $i_R$ through the first and second resistors 24, 26, regardless of output load, so that the resulting output voltage remains constant. If the LDO output stage 10 changes from a moderate load condition to a heavy load condition, for example, the portion of the output current $i_{out}$ that flows through the series combination of resistors 24 and 26 will start to reduce as more current is drawn by the load impedance 36. Consequently, the feedback voltage reaching the non-inverting input 44 of the OPAMP 12 will also begin to reduce. This will cause the output voltage of the OPAMP 12 to decrease, thus decreasing the gate voltage of the second transistor 18 (i.e., the source follower). As described above, the decrease in the gate voltage of the source follower transistor 18 causes an increase in the gate voltage applied to the third transistor 20, which increases the magnitude of the output current, $i_{out}$. The increase in $i_{out}$ results in an increase in $i_R$ that tends to maintain the value of $i_R$ at the desired level. The above described process will preferably be performed fast enough that there will be little or no noticeable change in the voltage on output terminal 34.

In a similar example, if the LDO output stage 10 changes from a moderate load condition to a light load condition, the portion of the output current $i_{out}$ that flows through the series combination of resistors 24 and 26 will begin to increase. Consequently, the feedback voltage reaching the non-inverting input 44 of the OPAMP 12 will also begin to increase. This causes the output voltage of the OPAMP 12 to increase which, in turn, causes the gate voltage of the third transistor 20 to decrease (i.e., by the action of the source follower transistor 18). The magnitude of the output current $i_{out}$ therefore decreases which results in a decrease in $i_R$ that tends to maintain the value of $i_R$ at the desired level. Again, the above process will preferably be performed fast enough that there will be little or no noticeable change in the voltage on output terminal 34.

The compensation capacitor 14 is coupled to the output terminal 46 of the OPAMP 12 to provide frequency compensation for the OPAMP 12. The addition of the compensation capacitor 14, however, introduces a low frequency dominant pole into the transfer function of the LDO output stage 10 that is located within the active frequency range of the LDO. In addition, as described previously, the load impedance 36 can introduce a load pole into the transfer function of the LDO output stage 10 that is also located within the active frequency range of the LDO. The load pole will have a frequency:

$$f_{LP} \approx \frac{1}{2\pi R_{load} C_{load}}.$$

The first transistor 16 is operative for providing a movable zero within the transfer function of the LDO output stage 10 to counteract the collective effect of the dominant pole and the load pole within the active frequency range of the LDO. In the illustrated embodiment, the first transistor 16 has a first source/drain terminal 52 connected to the compensation capacitor 14 and a second source/drain terminal 54 connected to the supply node 28. The resistance $R_{zero}$ between the first and second source/drain terminals 52 (i.e., output terminals), 54 is controlled by a control signal applied to the gate terminal 56 (i.e., input terminal) of the first transistor 16. The series combination of the compensation capacitor 14 and the resistance $R_{zero}$ generates a zero within the transfer function of the LDO output stage 10 having a frequency:

$$f_{zero} \approx \frac{1}{2\pi R_{zero} C_k}.$$

As illustrated in FIG. 2, the gate terminal 56 of the first transistor 16 is coupled to the upper source/drain terminal 48 of the second transistor 18. Therefore, the same control voltage that is applied to the gate terminal 50 of the third transistor 20 to control the magnitude of the output current $i_{out}$ is also applied to the gate terminal 56 of the first transistor 16 to control the resistance $R_{zero}$ between the two source/drain terminals 52, 54. As described previously, this control voltage will change based on a changing load condition of the LDO output stage 10. If the output load of the circuit increases, the control voltage increases and the resistance $R_{zero}$ decreases, thus increasing the frequency of the zero. If the output load of the circuit decreases, the control voltage decreases and the resistance $R_{zero}$ increases, thus decreasing the frequency of the zero. In this manner, the frequency of the zero will follow the frequency of the load pole during operation of the LDO output stage 10 as $R_{load}$ changes.

Figure 3:
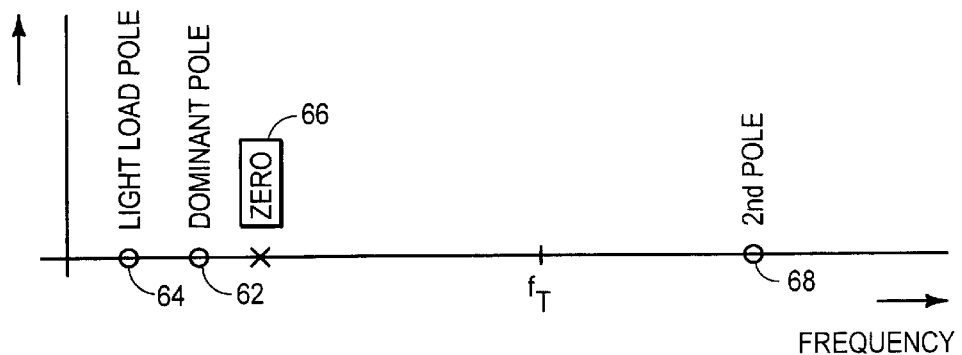
FIGS. 3 and 4 are frequency diagrams illustrating the location of the dominant pole and the load pole of the LDO output stage of FIG. 2 under light and heavy load conditions, respectively.
Figure 4:
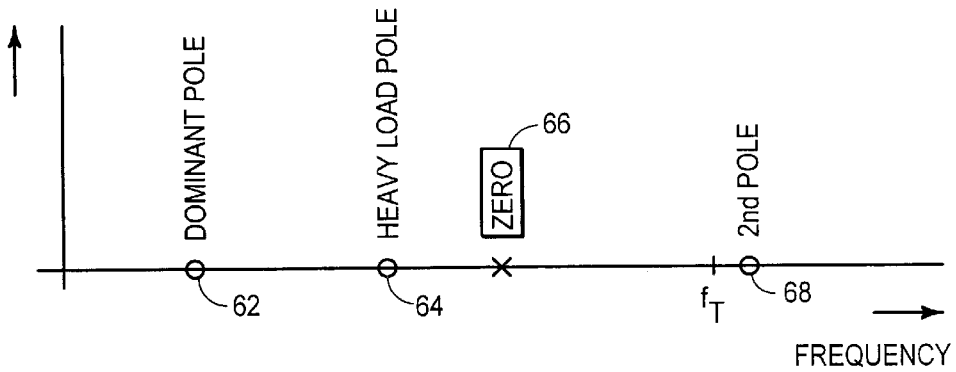

FIGS. 3 and 4 are frequency diagrams illustrating possible locations of the dominant pole and the load pole of the LDO output stage 10 of FIG. 2 under light and heavy load conditions, respectively. As shown, both the load pole 64 and the dominant pole 62 are located within the active frequency range of the LDO output stage 10, as indicated by the unity gain frequency $f_t$ of the output stage. In addition, a second pole 68 that is an internal pole of the OPAMP 12 is located outside the active frequency range of the LDO output stage 10. The dominant pole 62 and the second pole 68 each remain stationary under varying load conditions. The load pole 64, however, changes frequency based on the changing load impedance. Under light load conditions, as illustrated in FIG. 3, the load pole 64 has a relatively low frequency (due to a high $R_{load}$) that is below that of the dominant pole 62. In this situation, the zero 66 needs to have a low frequency that is proximate to the load pole 64 and/or the dominant pole 62 to maintain stability. Under heavy load conditions, as illustrated in FIG. 4, the load pole 64 has a frequency that is well above that of the dominant pole 62 (due to a low $R_{load}$). In this situation, the unity gain frequency $f_T$ increases so that it is much closer to the second pole 68. Thus, the zero 66 needs to be higher in frequency to provide compensation for, among other things, the influence of the second pole 68. In addition, under heavy load conditions, the frequency of the zero 66 should be such that adequate phase margin exists in the circuit.

Figure 5:
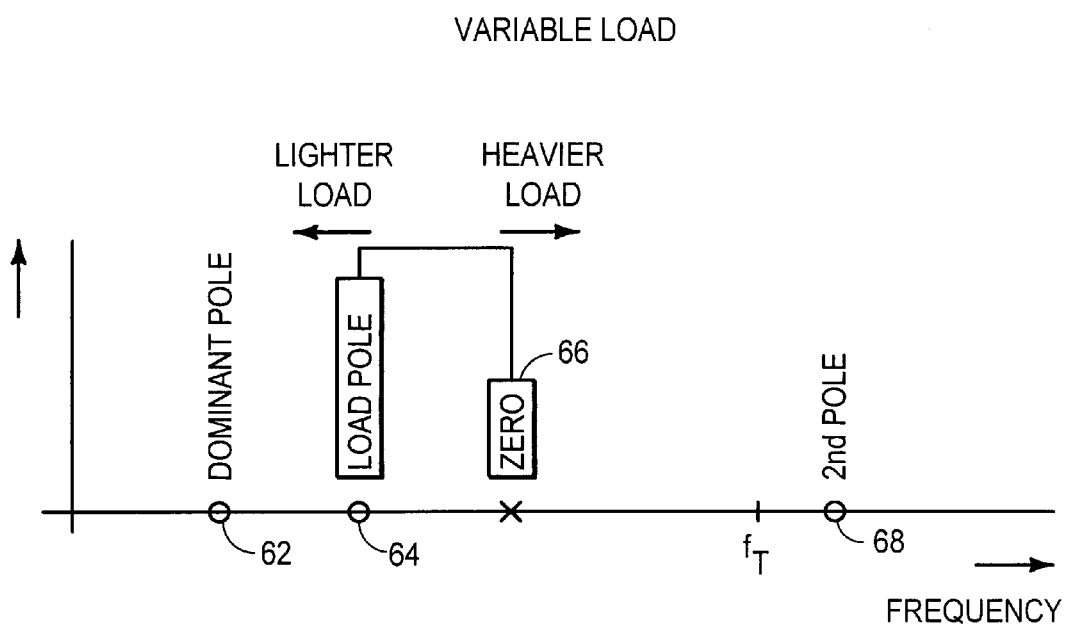
FIG. 5 is a frequency diagram illustrating the operation of the LDO output stage of FIG. 2 under varying load conditions.

FIG. 5 is a frequency diagram illustrating the operation of the LDO output stage 10 under varying load conditions. As illustrated, the zero 66 and the load pole 64 move together in frequency as the load condition changes. When the load on the circuit increases, the frequency of the load pole 64 and the frequency of the zero 66 both increase together. Likewise, when the load on the circuit decreases, the frequency of the load pole 64 and the frequency of the zero 66 both decrease together. Thus, the zero 66 is always in a frequency position that maintains stability as the load impedance changes.

Figure 6:
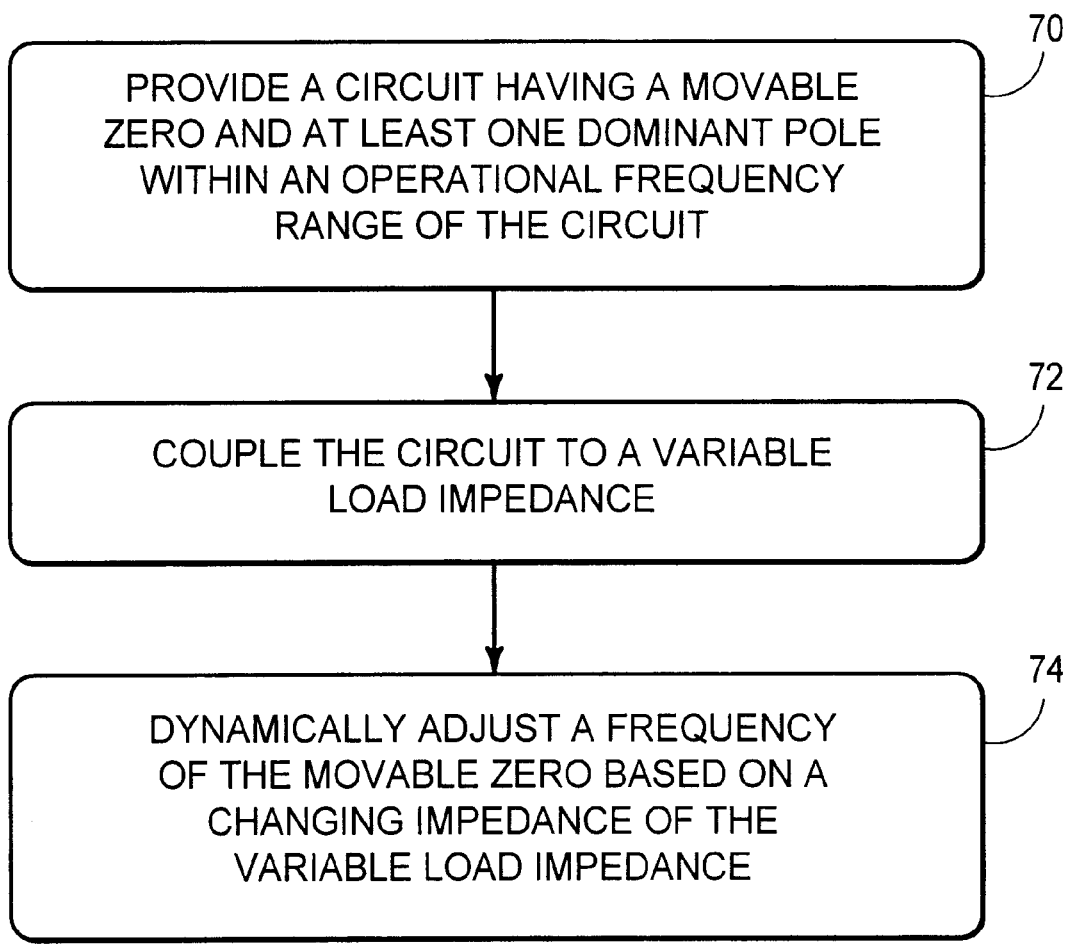
FIG. 6 is a flowchart illustrating a method for maintaining stability within a circuit in accordance with one embodiment of the present invention.

FIG. 6 is a flowchart illustrating a method for maintaining the stability of a circuit. First, a circuit having both a movable zero and at least one pole within its active frequency range is provided (step 70). The circuit can include, for example, a voltage regulator circuit utilizing frequency compensation. The circuit is coupled to a variable load impedance (step 72). The frequency of the movable zero is then dynamically adjusted based on the changing impedance value of the variable load impedance (step 74) so that it is continually in a location that provides an enhanced stability condition in the circuit, regardless of changes in load condition. As described previously, the frequency of the zero can be adjusted so that it tracks the frequency of the load pole as it changes.

Although the present invention has been described in conjunction with one or more embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A frequency compensated circuit comprising:
   a amplifier having a first output terminal coupled to a first input of the amplifier;
   an energy storage element coupled to a second output terminal of said amplifier to provide frequency compensation for said amplifier; and
   a variable resistance coupled to the second output terminal and said energy storage element to provide a movable zero in a transfer function of said frequency compensated circuit.

2. The frequency compensated circuit claimed in claim 1, wherein:
   said variable resistance changes resistance in response to a changing output load of said frequency compensated circuit.

3. The frequency compensated circuit claimed in claim 1, wherein:
   said variable resistance changes resistance so that said movable zero is continually in a frequency position to provide an enhanced stability condition for the frequency compensated circuit despite a varying load condition.

4. The frequency compensated circuit claimed in claim 1, comprising:
   an output port to connect said frequency compensated circuit to a variable load impedance that adds a variable frequency load pole to said transfer function of said frequency compensated circuit, wherein said variable resistance is to dynamically change resistance so that a frequency of said movable zero follows a frequency of said variable frequency load pole as said variable load impedance changes.

5. The frequency compensated circuit claimed in claim 1, wherein:
   said amplifier includes an operational amplifier.

6. The frequency compensated circuit claimed in claim 1, wherein:
   said variable resistance includes a transistor.

7. The frequency compensated circuit claimed in claim 1, wherein:
   said energy storage element includes a capacitor.

8. The frequency compensated circuit claimed in claim 1, wherein:
   said frequency compensated circuit is a voltage regulator circuit.

9. The frequency compensated circuit claimed in claim 8, wherein:
   said frequency compensated circuit is a low dropout voltage regulator circuit.

10. A voltage regulator, comprising:
    an operational amplifier having an output terminal;
    a capacitor coupled to said output terminal of said operational amplifier to provide frequency compensation for said operational amplifier;
    a variable resistance coupled to said capacitor to maintain stability within the voltage regulator under variable load conditions, wherein said variable resistance includes a first transistor having an input terminal and first and second output terminals, said first transistor displaying a resistance between said first and second output terminals that varies in response to a signal applied to said input terminal of said first transistor, said first output terminal of said first transistor being coupled to said capacitor; and
    a second transistor having an input terminal and first and second output terminals, said input terminal of said second transistor being coupled to said output terminal of said operational amplifier and said first output terminal of said second transistor being coupled to said input terminal of said first transistor.

11. The voltage regulator claimed in claim 10, comprising:
    an output node to couple the voltage regulator to a variable load impedance, wherein a resistance value of said variable resistance dynamically adjusts during operation of said voltage regulator based on an impedance value of said variable load impedance.

12. The voltage regulator claimed in claim 10, wherein:
    said variable load impedance introduces a variable frequency load pole into a transfer function of the voltage regulator when attached to the output node, said variable resistance introducing a variable frequency zero into the transfer function of the voltage regulator that tracks the variable frequency load pole during operation of the voltage regulator to maintain stability.

13. The voltage regulator claimed in claim 10, wherein:
    said signal applied to said input terminal of said first transistor varies based on a load impedance coupled to an output node of the voltage regulator.

14. The voltage regulator claimed in claim 10, comprising:
    a third transistor having an input terminal and first and second output terminals, said input terminal of said third transistor being coupled to said first output terminal of said second transistor, said first output terminal of said third transistor being coupled to a supply node, and said second output terminal of said third transistor being coupled to an output node of said voltage regulator.

15. The voltage regulator claimed in claim 14, comprising:
    a current source supplying current to said first output terminal of said second transistor to generate a control voltage on said input terminals of said first and third transistors.

16. A method for maintaining stability in a circuit, comprising:
    providing a circuit having a transfer function including at least one pole and a movable zero within an active frequency range of the circuit;
    feeding back a first output signal of the circuit to control a DC level of the circuit; and
    feeding back a second output signal of the circuit to adjust frequency values of the pole and movable zero.

17. The method claimed in claim 16, wherein:
    adjusting a frequency value of said movable zero includes changing a resistance value of a variable resistance.

18. The method claimed in claim 16, wherein:
   said variable load impedance adds a load pole to said transfer function that has a variable frequency, wherein adjusting a frequency value includes changing said frequency value of said movable zero to track said variable frequency of said load pole.

19. The method claimed in claim 16, wherein:
   said circuit includes a voltage regulator circuit.

20. The method claimed in claim 16, wherein:
   said circuit includes a low dropout voltage regulator circuit.

21. The frequency compensated circuit of claim 1, wherein the buffer comprises a buffer amplifier and an output transistor.

* * * * *